United States Patent
Park et al.

(10) Patent No.: US 10,153,855 B2
(45) Date of Patent: Dec. 11, 2018

(54) BROADCAST RECEIVER AND CONTROL METHOD THEREOF

(71) Applicant: SAMSUNG ELECTRONICS CO., LTD., Suwon-si, Gyonggi-do (KR)

(72) Inventors: Dong-jin Park, Yongin-si (KR); Jun-Seok Kang, Incheon (JP); Chang-hyo Kim, Seoul (KR); Kyoung-seok Noh, Suwon-si (KR); Sung-ki Son, Suwon-si (KR); Hyun-jong Shin, Suwon-si (KR); Young-jin Lee, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/456,764

(22) Filed: Mar. 13, 2017

(65) Prior Publication Data

US 2017/0272189 A1     Sep. 21, 2017

(30) Foreign Application Priority Data

Mar. 21, 2016  (KR) .................. 10-2016-0033591

(51) Int. Cl.
| | |
|---|---|
| *H04B 1/06* | (2006.01) |
| *H04H 60/32* | (2008.01) |
| *H03G 3/30* | (2006.01) |
| *H04L 27/00* | (2006.01) |

(52) U.S. Cl.
CPC .......... *H04H 60/32* (2013.01); *H03G 3/3052* (2013.01); *H03G 3/3063* (2013.01); *H04B 1/06* (2013.01); *H03G 2201/206* (2013.01); *H03G 2201/307* (2013.01); *H04L 27/0002* (2013.01)

(58) Field of Classification Search
None
See application file for complete search history.

(56) References Cited

U.S. PATENT DOCUMENTS

| | | | | |
|---|---|---|---|---|
| 4,461,036 A | * | 7/1984 | Williamson | H03J 5/0281 455/154.2 |
| 4,584,714 A | * | 4/1986 | Fukuhara | H03G 3/345 455/219 |
| 5,262,769 A | * | 11/1993 | Holmes | H04W 88/022 340/7.4 |
| 5,722,060 A | * | 2/1998 | Horigome | H03G 3/3052 455/234.1 |

(Continued)

FOREIGN PATENT DOCUMENTS

KR     10-0774202     11/2007

*Primary Examiner* — Lana N Le (74) *Attorney, Agent, or Firm* — Nixon & Vanderhye, P.C.

(57) ABSTRACT

Disclosed is a broadcast receiver that includes an antenna connector configured to connect with an antenna for receiving a broadcast signal including broadcast content. The broadcast receiver also includes a signal processor configured to generate a reference signal having a strength corresponding to a signal input through the antenna connector and to process the generated reference signal to output an image signal for displaying the broadcast content, and a controller configured to determine whether the antenna is connected to the antenna connector based on an output value of the reference signal and to perform subsequent operations related to whether the antenna is connected based on the determination.

15 Claims, 9 Drawing Sheets

(56) References Cited

U.S. PATENT DOCUMENTS

| | | | | |
|---|---|---|---|---|
| 2006/0025097 A1* | 2/2006 | Zahm | ................... | H01Q 1/3275 |
| | | | | 455/277.1 |
| 2007/0149146 A1* | 6/2007 | Hwang | .................. | H01Q 1/242 |
| | | | | 455/80 |
| 2008/0130599 A1* | 6/2008 | Horikoshi | ............ | H04B 7/0817 |
| | | | | 370/338 |
| 2009/0042526 A1* | 2/2009 | Maulik | ................ | H03G 3/3068 |
| | | | | 455/234.1 |
| 2011/0122258 A1* | 5/2011 | Masuda | ............... | H03G 3/3068 |
| | | | | 348/193 |
| 2013/0243067 A1* | 9/2013 | Kim | ..................... | H04B 1/1027 |
| | | | | 375/232 |
| 2014/0171004 A1* | 6/2014 | Morin | ..................... | H04B 1/16 |
| | | | | 455/234.1 |
| 2015/0082358 A1* | 3/2015 | Xiu | ........................ | H04N 7/104 |
| | | | | 725/70 |

* cited by examiner

BROADCAST RECEIVER AND CONTROL METHOD THEREOF

CROSS-REFERENCE TO RELATED APPLICATION

The application is based on and claims priority under 35 U.S.C. § 119 to Korean Patent Application No. 10-2016-0033591 filed on Mar. 21, 2016 in the Korean Intellectual Property Office, the disclosure of which is incorporated by reference herein in its entirety.

BACKGROUND

Field

The present disclosure relates generally to a broadcast receiver and a control method thereof, and for example, to a broadcast receiver, in which antenna connection is automatically determined, and a control method thereof.

Description of Related Art

Antenna connection is essential to search a channel during an initial setting process of a broadcast receiver and store information about the searched channel. If the antenna connection is not achieved, it is impossible to receive broadcast information and thus impossible to search a channel. Therefore, there is a need of checking whether the antenna is connected to the broadcast receiver so as to search broadcast channels.

However, a conventional broadcast receiver does not automatically determine whether the antenna is connected to the broadcast receiver, and directly receives a user's input about whether the antenna is connected or not before starting a broadcast channel search.

Figure 1:
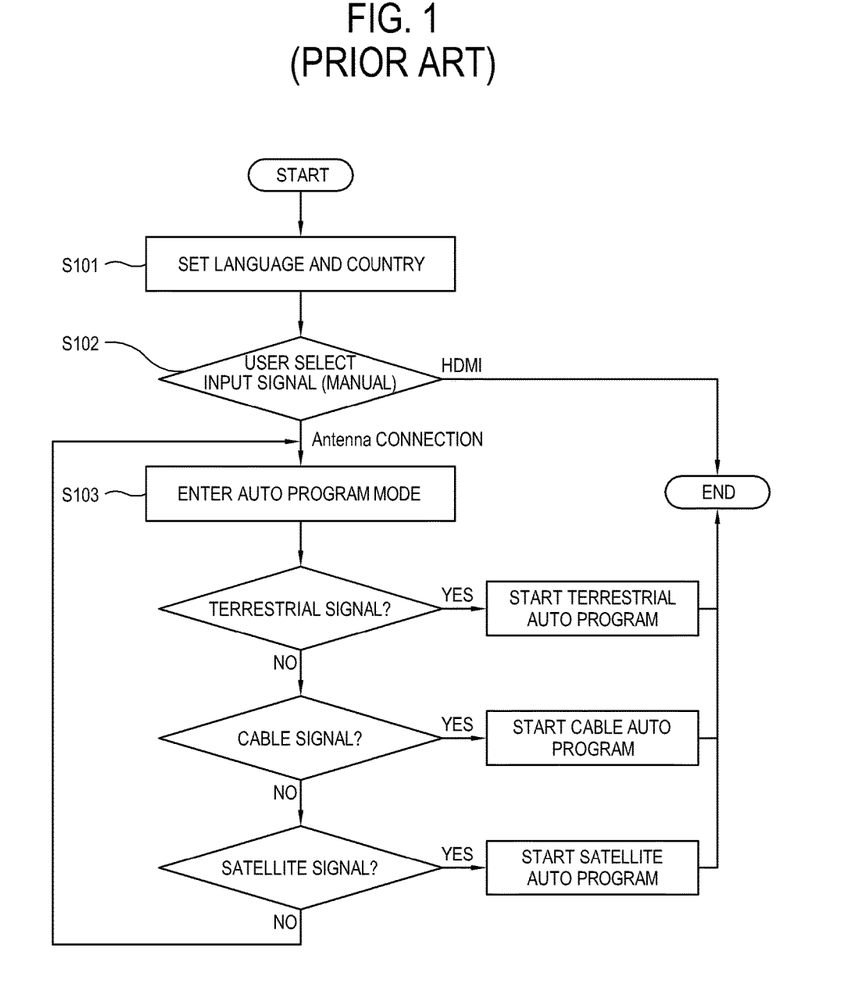
FIG. 1 is a flowchart illustrating a conventional initial setting process for a TV.

FIG. 1 is a flowchart illustrating an example of a conventional initial setting process of a television (TV). In case of the conventional initial setting process of the TV, a user has to set a language and a country (S101), and select whether an input signal to be received in the TV is a broadcast signal transmitted from an antenna or a signal from a high definition multimedia interface (HDMI) (S102). After a user's input that the antenna is connected to the TV (that is, the input signal is the broadcast signal), a channel auto-scan (i.e. auto program) starts (S103). Therefore, the initial setting process is delayed as much as a user's input and thus inconvenient for a user.

The reasons why the conventional broadcast receiver directly receives a user's input without automatically determining whether an antenna cable is connected thereto or not are because there were no techniques for sufficiently quickly measuring the strength of the signal input to the broadcast receiver and there were no efficient methods of accurately determining whether the antenna cable is connected or not based on the strength of the broadcast signal even though the strength of the received broadcast signal was measured.

Figure 2:
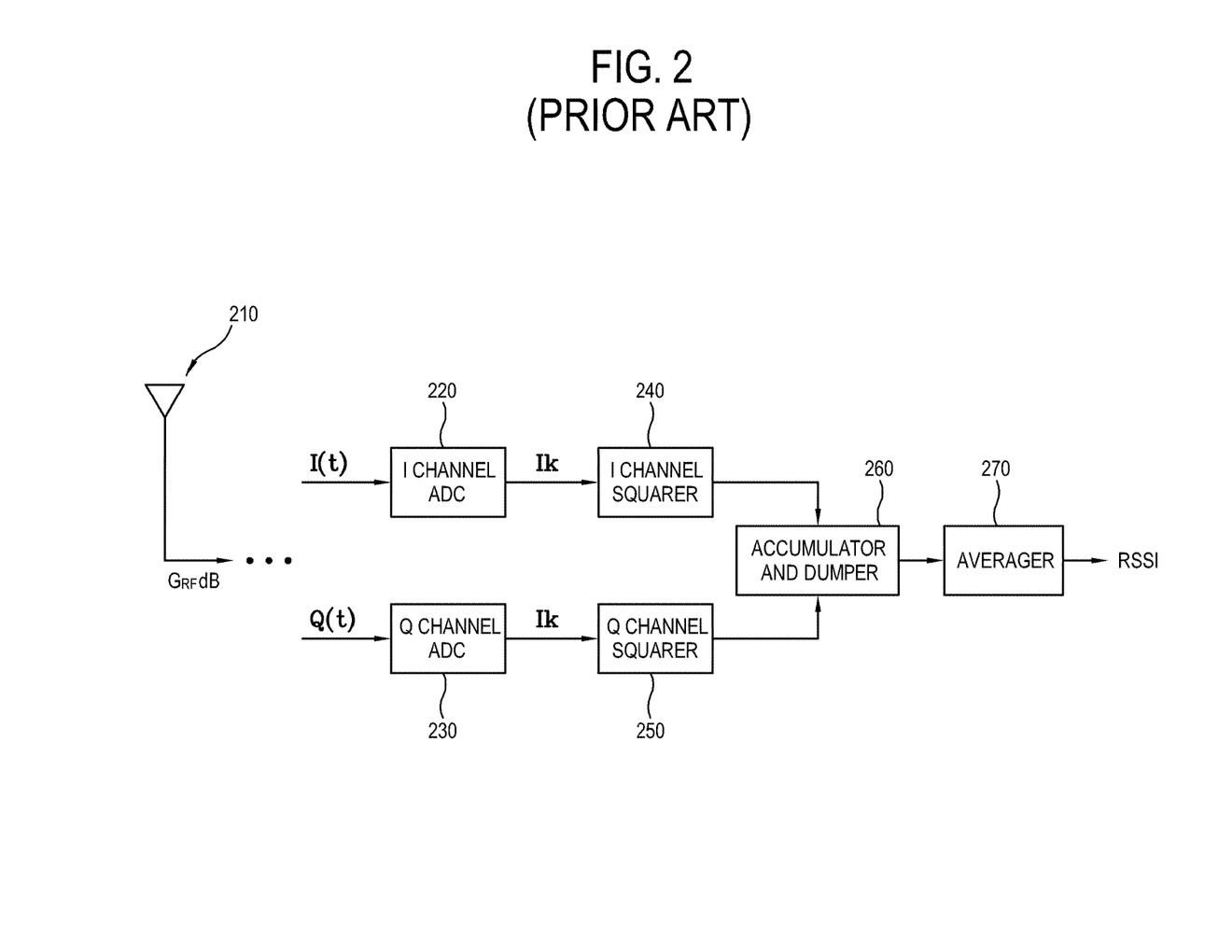
FIG. 2 is a diagram illustrating a conventional technique for measuring the strength (i.e. RSSI) of a signal input to a broadcast receiver.

FIG. 2 is a diagram illustrating an example of a conventional technique for measuring a received signal strength indicator (RSSI) of a signal input to the broadcast receiver. In such a conventional case, the RSSI is calculated by the following [Formula 1].

$$RSSI = \frac{1}{N}\sum_{k=0}^{N-1}(I_k^2 + Q_k^2) \qquad \text{[Formula 1]}$$

That is, an I channel signal I(t) and a Q channel signal Q(t) received through an antenna 210 are respectively converted into corresponding digital signals Ik and Qk by I and Q channel analog digital converters (ADC) 220 and 230, and then respectively squared by I and Q channel squarers 240 and 250. After that, the respective squared values are accumulated by an accumulator and dumper 260, and the accumulated values are finally averaged by an averager 270, thereby measuring the RSSI.

Like this, complicated processes were needed to conventionally measure the strength of the signal input to the broadcast receiver, i.e. the RSSI. To this end, complexity of hardware was also increased, and it took long time to measure the RSSI. Therefore, there was no effectiveness even though the broadcast receiver automatically determines whether the antenna is connected or not. To automatically determine whether the antenna is connected or not, the strength of the signal input to the broadcast receiver has to be measured according to broadcast frequencies, and the antenna connection has to be determined by a specific method based on the strength of the input signal. If it takes long time to measure the strength of the signal input to the broadcast receiver according to the broadcast frequencies, the automatic determination about the antenna connection is not more advantageous than a user's determination in light of time.

Further, there were no efficient conventional methods of accurately determining whether the antenna cable is connected or not based on the strength of the received broadcast signal even though the strength of the received broadcast signal is measured. The most basic method of automatically determining the antenna connection is that the strength of the signal input to the broadcast receiver is first measured according to the broadcast frequencies and it is then determined that the antenna cable is connected when anyone of the measured values is greater than a certain reference value. In this case, if the reference value is too high, it is determined that the antenna is not connected even though the antenna is actually connected since the strength of the received signal does not exceed the reference value. On the other hand, if the reference value is too low, it is determined that the antenna is connected even though the antenna is not actually connected since the strength of the signal received with noise exceeds the reference value. Accordingly, determination results are inaccurately obtained.

SUMMARY

An aspect of one or more example embodiments is to provide a broadcast receiver and a control method thereof, in which the strength of a signal input to the broadcast receiver is quickly measured to automatically determine whether or not an antenna cable is connected to the broadcast receiver.

Further, another example aspect is to more accurately measure whether the antenna is connected or not based on the strength of a received broadcast signal measured as above.

According to an aspect of an example embodiment, a broadcast receiver is provided, including: an antenna connector configured to connect to an antenna for receiving a broadcast signal including broadcast content; a signal processor configured to generate a reference signal having a strength corresponding to a signal input through the antenna connector, and to process the generated reference signal to output an image signal for displaying the broadcast content; and a controller configured to determine whether the antenna is connected to the antenna connector based on an output value of the reference signal, and to perform subsequent operations related to whether the antenna is connected based on the determination result.

The reference signal may be generated in the signal processor by performing at least one among amplifying, filtering and mixing with regard to the signal input through the antenna connector to output the image signal.

According to an example embodiment, the reference signal to be referred to for determining the antenna connection is not a signal separately designed for the present embodiment but a signal originally used in a conventional broadcast receiver. Therefore, the present example embodiment advantageously employs the conventional broadcast receiver as it is without adding a separate hardware component in order to determine whether the antenna is connected and control the subsequent operations.

The signal processor may include an automatic gain controller to make the strength of the signal input through the antenna connector be constant based on the reference signal.

If the strength of the signal input to the antenna connector is calculated with the values measured in the level detector of the automatic gain controller, e.g., with the signal gain indicator (SGI, to be described later), it is possible to determine the strength of the signal input through the antenna connector within several tens of ms, which is faster than the measuring speed of the conventional RSSI measuring method. Further, it is advantageous to determine the strength of the signal without adding a separate hardware component. Since the strength of the input signal is calculated before the demodulation, it is possible to determine whether the antenna is connected, regardless of broadcasting type (e.g. analog, digital, terrestrial, cable and satellite broadcasts) of the signal input to the antenna connector, and it is therefore possible to apply the present disclosure to all kinds of broadcast receivers.

The controller may determine that the antenna is connected to the antenna connector if the output value of the reference signal measured according to frequencies of the broadcast signal is equal to or higher than a first reference value.

The SGI measuring method according to an example embodiment is faster than the conventional RSSI measuring method when determining whether the antenna is connected to the broadcast receiver.

The controller may determine that the antenna is connected to the antenna connector if the output value of the reference signal is equal to or higher than a first reference value or if a case where the output value of the reference signal is equal to or higher than a second reference value lower than the first reference value occurs more than a reference number of times.

The reference number of times may be set in consideration of a probability that a signal having a strength corresponding to the second reference value will be detected because of noise even though the antenna is not connected to the antenna connector.

The foregoing method obtains more accurate results since it is determined once more whether the antenna is connected based on the second reference value lower than the first reference value.

The second reference value may be adjusted by the controller. Thus, it is possible to obtain more accurate results if the adjusted reference value or reference number of times is used to determine whether the antenna is connected.

The antenna connector may include a single input port to which one among a plurality antennas for respectively inputting signals corresponding to one among a plurality of broadcast types is connectable. Accordingly, the broadcast receiver according to an example embodiment is usable regardless of the broadcast types.

The controller may perform a channel auto-scan with respect to the broadcast signal if it is determined that the antenna is connected to the antenna connector. In this case, the initial setting process of the broadcast receiver becomes easier since it is automatically determined whether the antenna is connected without receiving a user's input and thus a channel auto-scan function is performed.

According to an aspect of another example embodiment, a method of controlling a broadcast receiver is provided. The method may include: measuring an output value of a reference signal having a strength corresponding to a signal input to the broadcast receiver; determining whether an antenna is connected to the broadcast receiver based on the measured output value of the reference signal; and performing subsequent operations related to whether the antenna is connected based on the determination results.

The reference signal may be generated by performing at least one among amplifying, filtering and mixing with regard to the signal input so as to output the image signal.

The reference signal may be an internal signal of an automatic gain controller for making the strength of the signal input through the broadcast receiver be constant.

The determining whether the antenna is connected may include determining that the antenna is connected to the broadcast receiver if the output value of the reference signal measured according to frequencies of a broadcast signal received in the broadcast receiver is equal to or higher than a first reference value.

The determining whether the antenna is connected may include determining that the antenna is connected to the broadcast receiver if the measured output value of the reference signal is equal to or higher than a first reference value or if a case where the measured output value of the reference signal is equal to or higher than a second reference value lower than the first reference value occurs more than a reference number of times.

The reference number of times may be set in consideration of a probability that a signal having a strength corresponding to the second reference value will be detected because of noise even though the antenna is not connected to the antenna connector.

The method may further include adjusting the second reference value by the broadcast receiver.

The method may further include performing a channel auto-scan with respect to a broadcast signal received in the broadcast receiver if it is determined that the antenna is connected to the broadcast receiver.

BRIEF DESCRIPTION OF THE DRAWINGS

The above and/or other aspects, features and attendant advantages of the present disclosure will become apparent and more readily appreciated from the following detailed description, taken in conjunction with the accompanying drawings, in which like reference numerals refer to like elements, and wherein.

DETAILED DESCRIPTION

Below, various example embodiments will be described in greater detail with reference to accompanying drawings. However, the structures and functions illustrated in the following example embodiments do not limit the present disclosure and the key structures and functions. In the following descriptions, detailed descriptions about publicly known functions or elements may be omitted in the following description and accompanying drawings if it is determined that they cloud the gist of the present disclosure.

In the following example embodiments, terms including ordinal numbers such as first, second and the like are employed just for distinguishing between one element and another element without limiting the meanings of the elements. Further, a singular expression may involve a plural expression as long as it does not clearly give different meaning contextually. In the following descriptions, terms such as 'comprise', 'include' or 'have' do not exclude presence or addition of one or more other features, numbers, steps, operations, elements, components or combination thereof. In addition, a 'module' or a 'portion' may perform at least one function or operation, be achieved by hardware or software or combination of hardware and software, and a plurality of 'modules' or a plurality of 'portions' may be modularized into at least one processor. In the following example embodiment, if a certain portion 'is connected to' another portion, it may mean that they are not only 'directly connected' but also 'electrically connected' via a device, a cable or the like.

Figure 3:
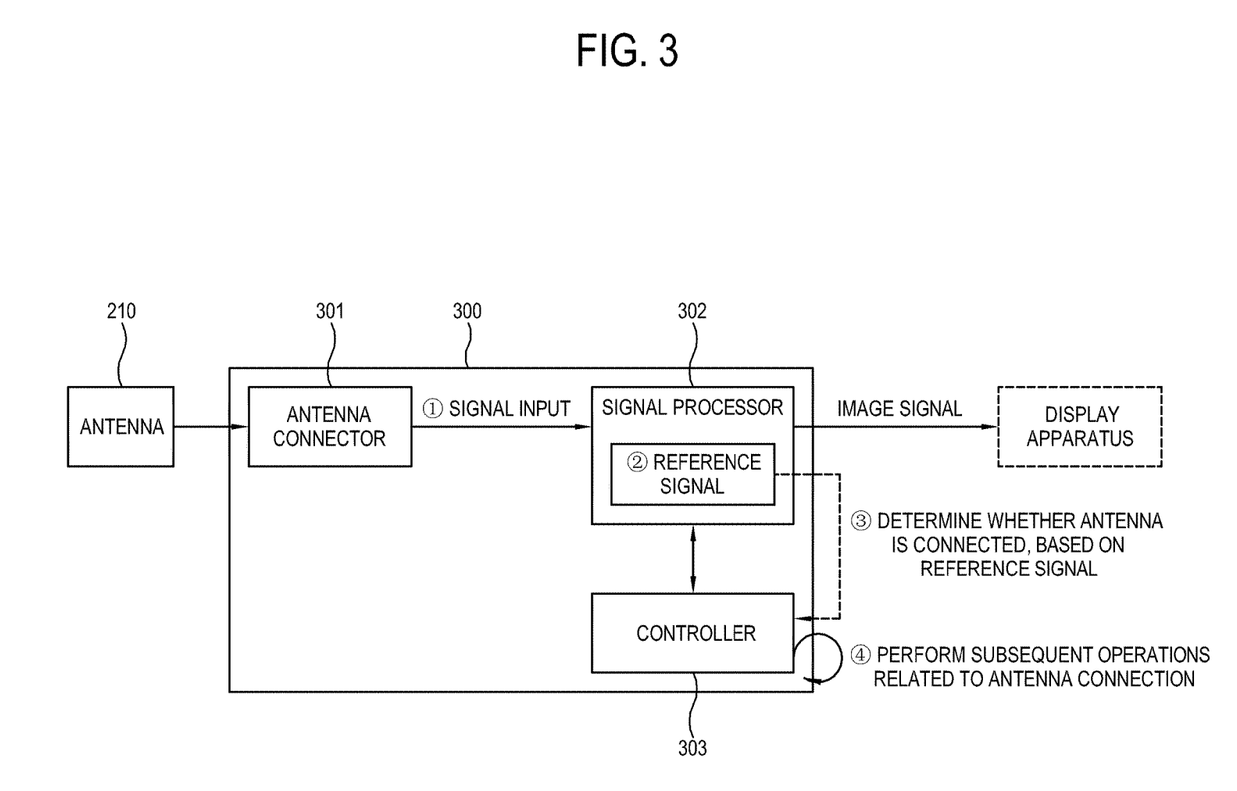
FIG. 3 is a block diagram illustrating an example broadcast receiver according to an example embodiment of the present disclosure.

FIG. 3 is a block diagram illustrating an example broadcast receiver 300 according to an example embodiment of the present disclosure;

The broadcast receiver 300 in this example embodiment wirelessly receives a broadcast signal from a transmission side, e.g. a transmitter of a broadcasting station or the like. The broadcast receiver 300 may be achieved variously. The broadcast receiver 300 may be a television (TV) for displaying a broadcast image, or a set-top box for processing and outputting a broadcast signal to an external display apparatus so that the external display apparatus can display a broadcast image. Further, the broadcast receiver 300 may be a relay for receiving the broadcast signal and delivering it to another device.

The broadcast receiver 300 is tuned to a broadcast signal received in an antenna 210, and converts it into a digital signal, in which the digital signal is transitioned into a baseband to undergo de-multiplexing and decoding so that a broadcast image can be displayed.

According to an example embodiment, the broadcast receiver 300 includes an antenna connector 301, a signal processor 302, and a controller (e.g., including processing circuitry) 303.

The antenna connector 301 connects to the antenna 210 for receiving a broadcast signal in which broadcast content is embedded. The antenna 210 is a converting device for transmitting or receiving electromagnetic waves within a specific band, in which electromagnetic waves of a radio frequency (RF) band are converted into an electric signal or an electric signal is converted into electromagnetic waves.

The signal processor 302 may include various circuitry that receives a signal input through the antenna connector 301 and applies various processes to the received signal so that an image signal can be output to display broadcast content embedded in the signal. The output image signal is transmitted to the display apparatus or the like, but is not limited thereto.

There are no limits to the kind of image processing processes performed in the signal processor 302. For example, the image processing processes may include de-multiplexing for dividing an input stream into sub streams such as video, audio and auxiliary data; decoding corresponding to an image format of an image stream; de-interlacing for converting an interlaced type image stream into a progressive type; scaling for adjusting an image stream to have a preset resolution; noise reduction for improving image quality; detail enhancement; frame refresh rate conversion, etc. The signal processor 302 may be achieved by a system on chip (SoC) where the foregoing processing processes are integrated, or an image processing board where individual chip-sets for independently performing the foregoing processes are mounted on a printed circuit board.

The controller 303 may include various processing circuitry and basically plays a key role of analyzing and calculating data as an element to perform main calculation for operating general elements of the signal processor 302. The controller 303 internally includes various processing circuitry, such as, for example, and without limitation, a processor register where commands to be processed are stored; an arithmetic logic unit (ALU) for comparison, determination and calculation; a control unit for internally controlling the controller 303 to analyze and correctly follow the command; an internal bus; a cache; etc. Further, the controller 303 externally includes a volatile memory, e.g., a random access memory (RAM) to which data to be processed is loaded.

Below, a detailed structure of the signal processor 302 will be described with reference to FIG. 4.

Figure 4:
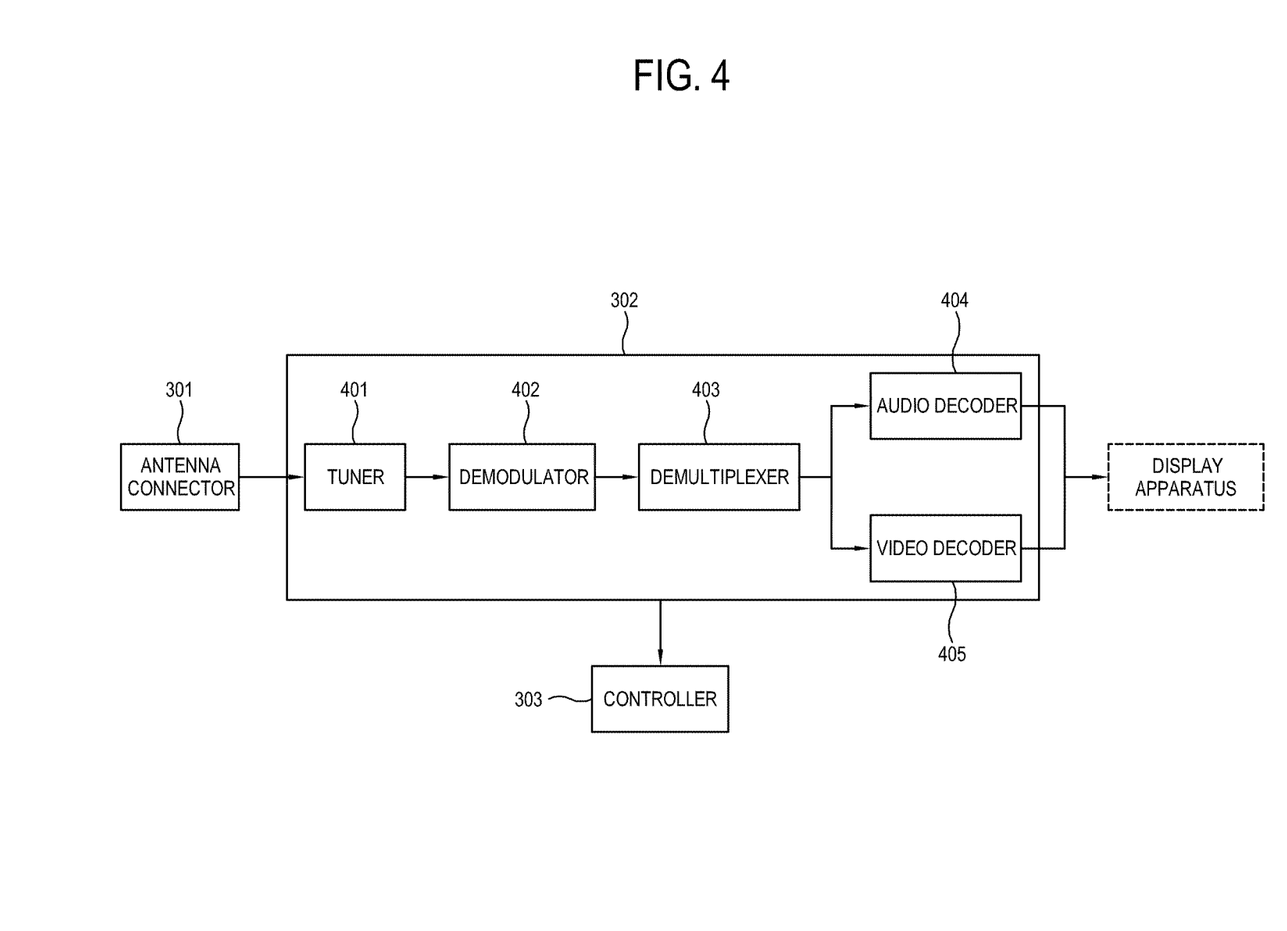
FIG. 4 is a block diagram illustrating an example signal processor in the broadcast receiver according to an example embodiment of the present disclosure.

FIG. 4 is a block diagram illustrating an example structure of the signal processor 302. FIG. 4 illustrates only a basic example structure of the signal processor 302, and thus an actual product of the signal processor 302 may include other elements in addition to those set forth herein.

The signal processor 302 includes a tuner 401 to be tuned to a specific frequency with regard to the received broadcast signal. Further, the signal processor 302 includes a demodulator 402 for demodulating the received signal, a demultiplexer 403 for dividing the received signal into a plurality of sub signals and processing and outputting them, and decoders 404 and 405 for decoding the sub signals output from the demultiplexer 403.

For example, the tuner 401 is tuned to a frequency of a specific designated channel for the broadcast signal if the broadcast signal is for example received from the antenna connector 301, and converts the broadcast signal into a transport stream. The tuner 401 converts a carrier wave of a high frequency received from the antenna connector 301 into that of an intermediate frequency band, and converts it into a digital signal, thereby generating a transport stream. To this end, the tuner 401 may include an analog/digital (A/D) converter. Alternatively, the A/D converter may be included in not the tuner 401 but the demodulator 402.

The demodulator 402 plays an opposite role of a modulator for modulating a signal, and thus converts a broadcast signal received through the antenna connector 301 into the transport stream. Since the broadcast signal input to the antenna connector 301 is in a state of being modulated at the transmission side, the demodulator 402 demodulates the modulated signal into an original signal to be processed in the signal processor 302. The signal demodulated by the demodulator 402 and transmitted from the demodulator 402 to the deMUX 403 is given in the form of a transport stream.

The demultiplexer or deMUX 403 basically plays an opposite role of the multiplexer. That is, the demultiplexer 403 connects one input terminal to a plurality of output terminals, and thus distributes a stream input to the input terminal to the output terminal in accordance with a selection signal. For example, if there are four output terminal with respect to one input terminal, each of the four output terminals may be selected by combination of two selection signals having a level of '0' or '1'.

For the broadcast receiver 300, the demultiplexer 403 divides the transport stream received from the tuner 401 into sub signals such as a video stream, an audio stream and an auxiliary stream, and outputs the sub signals to the respective output terminals.

The demultiplexer 403 may have many ways of dividing the transport stream into the sub signals. For example, the demultiplexer 403 divides the transport stream into sub signals in accordance with packet identifiers (PID) respectively assigned to packets of the transport stream. In the transport stream, the sub signals according to channels are independently compressed and packetized, and packets corresponding to a certain channel are assigned with the same PID to be distinguished from packets of the other channels. The demultiplexer 403 classifies the packets of the transport stream according to the PID and extracts the sub signals having the same PID.

The decoders 404 and 405 respectively decode the sub signals output from the demultiplexer 403. In this example embodiment, two decoders 404 and 405 are provided, but not limited thereto. Alternatively, a single decoder may be provided, or a plurality of decoders may be provided to respectively decode sub signals. For example, the decoder may include an auxiliary-data decoder for decoding auxiliary data or the like decoder in addition to an audio decoder 404 for decoding an audio signal and a video decoder 405 for decoding a video signal.

Since the sub signals transmitted to the decoders 404 and 405 are in a state of being encoded to have specific formats, the decoders 404 and 405 reverse the encoding procedures of the sub signals to thereby perform a decoding process for returning the sub signals to original signals as before encoding. Therefore, if the not-encoded, i.e. uncompressed sub signals are output from the demultiplexer 403, these sub signals may bypass the decoders 404 and 405.

Below, referring back to FIG. 3, a procedure of determining whether the antenna is connected based on a reference signal in the broadcast receiver 300 having the structure as illustrated in FIGS. 3 and 4 will be described. Here, the reference signal will be defined in the following description.

A signal is input from the antenna connector 301 to the signal processor 302 ($\hat{1}$). If the antenna connector 301 connects with the antenna 210, most of signals input to the signal processor 302 may be broadcast signals received in the antenna 210. However, other signals than the broadcast signal may be input to the antenna 210. Even if the antenna connector 301 does not connect with the antenna 210, noise or the like signal may be input to the signal processor 302. Therefore, the broadcast receiver 300 cannot predicate that the antenna 210 is connected to the antenna connector 301 even though the signal processor 302 receives an input signal, and has to determine whether the antenna 210 is connected or not based on the strength or the like of the input signal.

The signal processor 302 receives a signal input through the antenna connector 301 as above, and processes the received signal through various processes to output an image signal. During the processes, the signal processor 302 generates at least one 'reference signal' having strength corresponding to the signal input through the antenna connector 301 ($\hat{2}$).

Here, the 'reference signal' may refer, for example, to a signal related to a unique operation such as, input, generation, transfer, amplification, filtering, mixing, output, etc. performed by each internal element of the signal processor 302 as illustrated in FIG. 4 with respect to the signal input through the antenna connector 301 in order to output an image signal. Further, the 'reference signal' may refer, for example, to a signal, which has strength corresponding to the signal input through the antenna connector 301, among signals related to the unique operations performed by the respective internal elements of the signal processor 302. Therefore, among the signals needed for the internal elements of the signal processor 302, e.g. the tuner 401, the demodulator 402, the demultiplexer 403, the decoders 404 and 405 and the like to perform their own operations with regard to the signals input through the antenna connector 301 in order to output an image signal based on the signal input through the antenna connector 301, any signal may be used as the 'reference signal' of this example embodiment as long as its strength corresponds to the strength of the signal input through the antenna connector 301. In general, most of signals to be processed by the internal elements of the signal processor 302 are the broadcast signals input through the antenna. However, according to an example embodiment, the antenna connection has to be determined based on the characteristic of the reference signal under the condition that it is uncertain whether the signal input through the antenna connector 301 is the broadcast signal or not. For example, a signal to be processed by the internal elements of the signal processor 302 may be not the broadcast signal but a noise signal.

The controller 303 determines whether the antenna 210 is connected to the antenna connector 301, based on the foregoing characteristic of the reference signal ($\hat{3}$), and controls the broadcast receiver 300 to perform the subsequent operations related to the antenna connection in accordance with determination results ($\hat{4}$). According to an example embodiment, the characteristic of the reference signal includes the strength of the reference signal. Thus, the controller 303 may determine whether the antenna 210 is connected to the antenna connector 301, based on whether the strength of the reference signal is equal to or greater than a predetermined reference value. The reference value for the strength of the reference signal may be determined to correspond to the typical strength of the broadcast signal receivable when the antenna 210 is connected to the antenna connector 3011 the antenna 210.

The subsequent operations related to the antenna connection may include, for example, and without limitation, a channel auto-scan, but not limited thereto and may include any operations related to the antenna connection. As a control method of performing the subsequent operations related to the antenna connection, a control command for a corresponding operation may be transmitted to the inside or outside of the broadcast receiver 300, but not limited thereto. In other words, any control method is possible as long as it performs the subsequent operations related to the antenna connection.

According to an example embodiment, the reference signal to be referred to for determining the antenna connection is not a signal separately designed for the present embodiment but a signal originally used in a conventional broadcast receiver. Therefore, the present example embodiment advantageously employs the conventional broadcast receiver as it is without adding a separate hardware component to determine whether the antenna is connected and control the subsequent operations.

As a more detailed example, an embodiment, where a signal processed in the automatic gain controller (AGC) 503 is used as the reference signal for determining whether the antenna is connected, will be described below with reference to FIG. 5 and FIG. 6.

Figure 5:
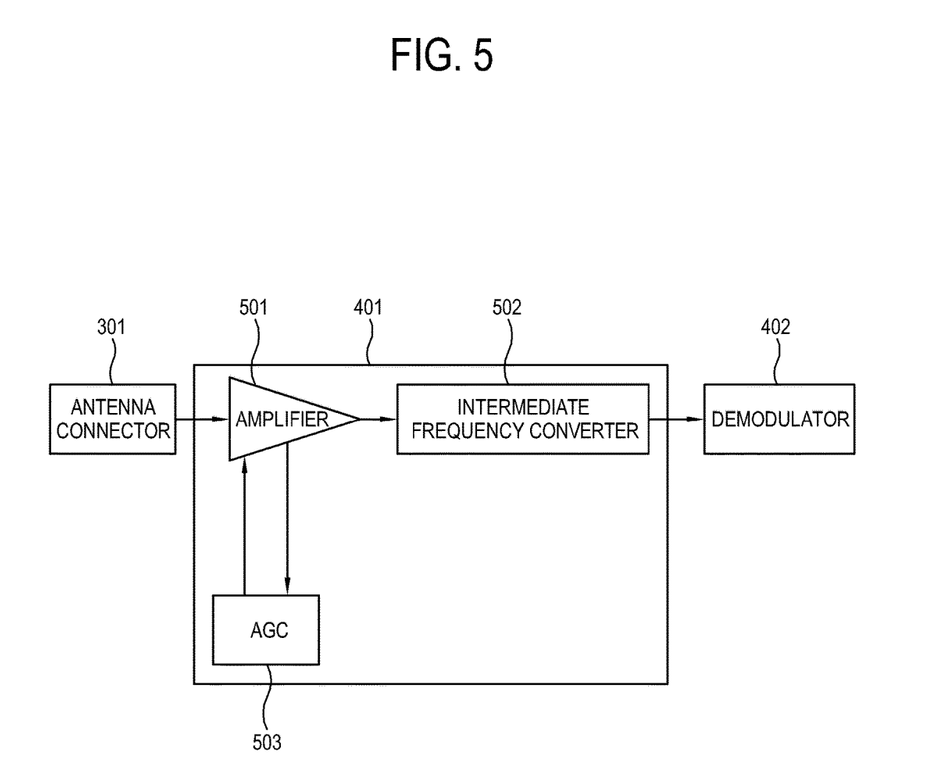
FIG. 5 is a block diagram illustrating an example tuner in a broadcast receiver according to another example embodiment of the present disclosure.
Figure 6:
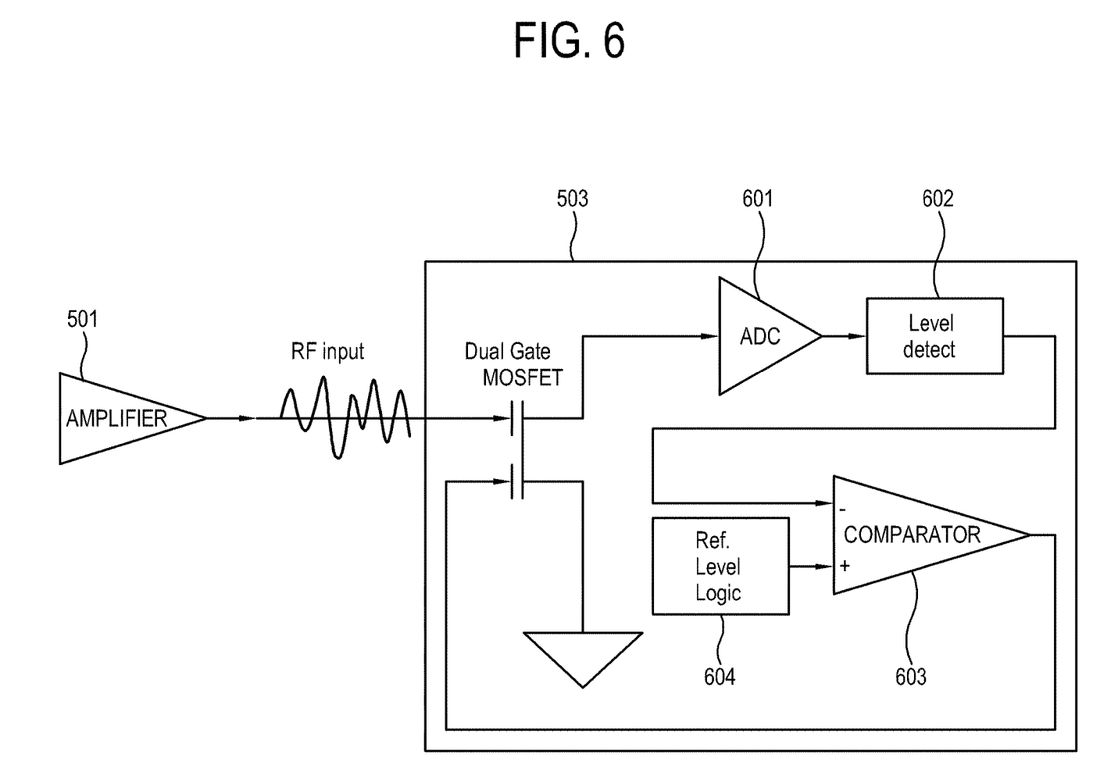
FIG. 6 is a block diagram illustrating an example automatic gain controller in a broadcast receiver according to another example embodiment of the present disclosure.

FIG. 5 is a block diagram illustrating an example structure of a tuner 401 in a broadcast receiver 300 according to another example embodiment of the present disclosure. The tuner 401 in this embodiment includes an automatic gain controller 503 for making the strength of a signal input through the antenna connector 301 constant.

In this embodiment, a signal input through the antenna connector 301 is amplified by an amplifier 501 and then distributed to an intermediate frequency converter 502.

The intermediate frequency converter 502 receives the signal amplified by the amplifier 501, passes only a receiving frequency band through a bandpass filter, and mixes the signal passed through the filter with a signal of a high-frequency phase synchronizer, thereby obtaining a signal of an intermediate frequency band.

The signal amplified by the amplifier 501 is distributed to not only the intermediate frequency converter 502 but also the automatic gain controller 503. The automatic gain controller 503 controls a gain to maintain a constant frequency level regardless of the strength of the input signal and feeds the controlled gain back to the amplifier 501.

A more detailed structure of the automatic gain controller 503 will be described with reference to FIG. 6.

The automatic gain controller 503 receives the signal amplified by the amplifier 501, converts it into a digital signal through an analog digital converter (ADC) 601, and detects a level of the converted signal through a level detector 602. The comparator 603 compares the level of the detected signal with a reference value output from a reference level logic 604 and outputs a result of the comparison.

Among such internal signals of the automatic gain controller 503, the output signal of the ADC 601 is used as the reference signal by the controller 303 in determining whether the antenna is connected to the antenna connector 301. The output signal from the ADC 601 is given in the form of a pulse width modulation (PWM). The level detector 602 in the automatic gain controller 503 integrates such a PWM output of the ADC 601 through an integration circuit and applies log scale to the integrated PWM output, thereby calculating an output level of the ADC output signal used as the reference signal in units of dBmV.

The controller 303 draws the strength of the signal input through the antenna connector 301 from the output level of the reference signal calculated in the level detector 602 of the automatic gain controller 503. For this, the following [formula 2] is used.

$$dBmV \approx (dBm + 47 \text{ dB}) \qquad \text{[Equation 2]}$$

For example, since the output value of the reference signal calculated by the level detector 602 in the automatic gain controller 503 is given in units of dBmV, it is possible to calculate the strength, e.g., the RSSI of the signal input through the antenna connector 301 in units of dBm by the above formula of subtracting 47 dB from the output value of the reference signal.

Hereinafter, the RSSI calculated by the foregoing method will be called a signal gain indicator (SGI). This is to distinguish the RSSI measured using the reference signal of the automatic gain controller 503 from the RSSI measured using the conventional method.

As described above, if the strength of the signal input to the antenna connector 301 is calculated with the values measured in the level detector 602 of the automatic gain controller 503, e.g., with the SGI, it is possible to determine the strength of the signal input through the antenna connector 301 within several tens of ms, which is faster than the measuring speed of the conventional RSSI measuring method. Further, it is advantageous to determine the strength of the signal without adding a separate hardware component. Since the strength of the input signal is calculated before the demodulation, it is possible to determine whether the antenna is connected or not, regardless of broadcasting types (e.g. analog, digital, terrestrial, cable and satellite broadcasts) of the signal input to the antenna connector 301, and it is therefore possible to apply the present disclosure to all kinds of broadcast receivers.

Below, a method of determining whether the antenna is connected to the antenna connector 301, based on the SGI will be described.

Figure 7:
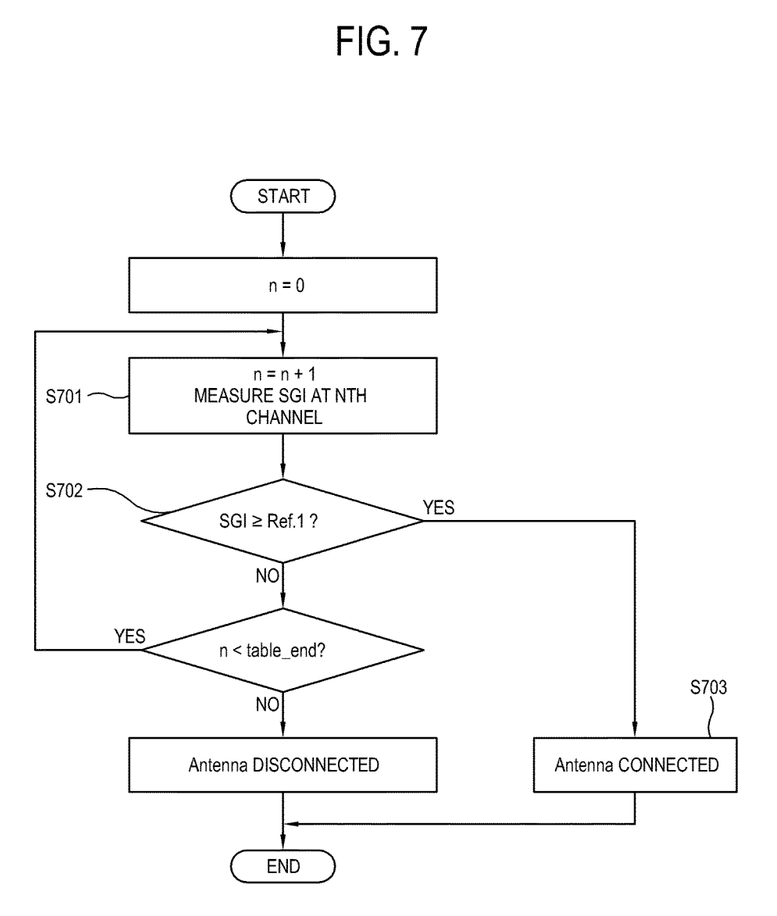
FIG. 7 is a flowchart illustrating an example of determining whether an antenna is connected, by a signal gain indicator (SGI) according to an example embodiment of the present disclosure.

FIG. 7 is a flowchart illustrating an example of determining whether an antenna is connected, by the SGI according to an example embodiment of the present disclosure. The controller 303 measures the SGI according to the frequencies of the broadcast signal to be input through the antenna by the foregoing method or the like (S701). In case of America, a table is defined for determining a terrestrial broadcast frequency, and thus the SGI is measured according to the frequencies defined in the frequency table. In case of Europe, the SGI is measured at intervals of 8 MHz from the first frequency.

Then, the measured SGI is compared with the first reference value (S702). If the SGI is equal to or higher than the first reference value, the controller 303 determines that the antenna is connected (S703) and performs the subsequent operations related to the antenna connection. Here, the first reference value, which is employed for determining whether the antenna is connected or not, is a value that gives reliability to a result that an input signal having strength higher than the first reference value is determined as a broadcast signal received through the antenna. The first reference value may be set when or after the broadcast receiver 300 is designed or may be modified. The first reference value may be empirically obtained through experiments. According to an example embodiment, the first reference value is set to −80 dBm.

Like this, the SGI measuring method according to an example embodiment is faster than the conventional RSSI measuring method when it is determined whether or not the antenna is connected to the broadcast receiver 300.

Figure 8:
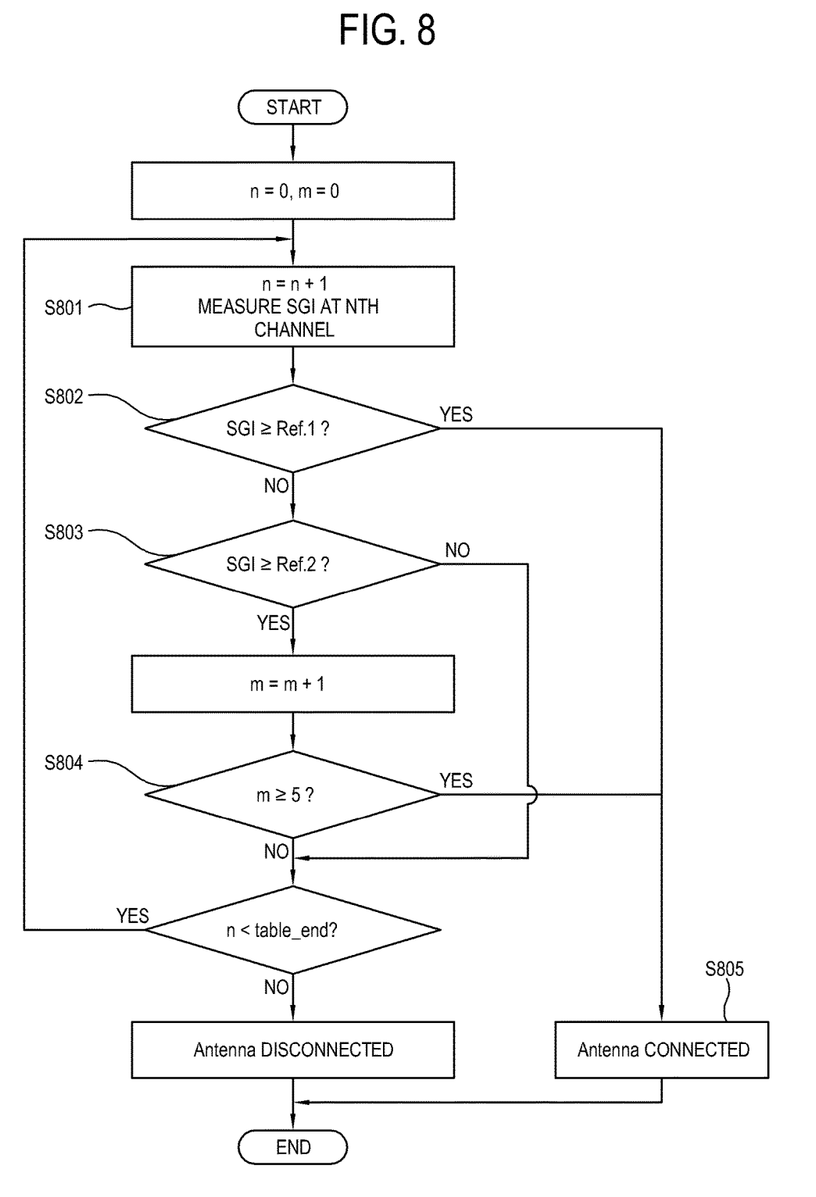
FIG. 8 is a flowchart illustrating an example of determining whether an antenna is connected, by a SGI according to another example embodiment of the present disclosure.

FIG. 8 is a flowchart illustrating an example of determining whether an antenna is connected, by a SGI according to another example embodiment of the present disclosure. In terms of measuring the SGI according to the frequencies, the method of FIG. 8 is the same as that of FIG. 7 (S801). In addition to the method of FIG. 7, the SGI lower than the first reference value (S802) is further compared with a second reference value lower than the first reference value (S803). If a case where the SGI is equal to or higher than the second reference value occurs more than a reference number of times (S804), it is determined that the antenna is connected to the antenna connector 301 (S805).

Here, the reference number of times may be set in consideration of a probability that a signal having strength corresponding to the second reference value will be detected because of noise even though the antenna is not connected to the antenna connector 301, but not limited thereto. Likewise, the second reference value may also be set in consideration of the strength of a signal detected because of noise even though the antenna is not connected to the antenna connector 301, but not limited thereto. The second reference value and the reference number of times may be empirically obtained through experiments. In this embodiment, the second reference value is −86 dBm, and the reference number of times is five times. This is based on field test results of about 2,000 times, in which the maximum noise of 86 dBm is sensed twice in the broadcast receiver 300 under the condition that the antenna is not connected.

The method illustrated in FIG. 8 of determining whether the antenna is connected or not is more accurate than that shown in FIG. 7. If the reference value is too high, the method of FIG. 7 may determine that the antenna is not connected even though the antenna is actually connected to the broadcast receiver 300. However, under the same condition, the method of FIG. 8 obtains more accurate results since it is determined once more whether the antenna is connected based on the second reference value lower than the first reference value.

The reference values and the reference number of times may be set when or after the broadcast receiver 300 is designed or may be modified. Further, the broadcast receiver 300 itself may properly adjust the reference values and the reference number of times based on self-feedback.

Figure 9:
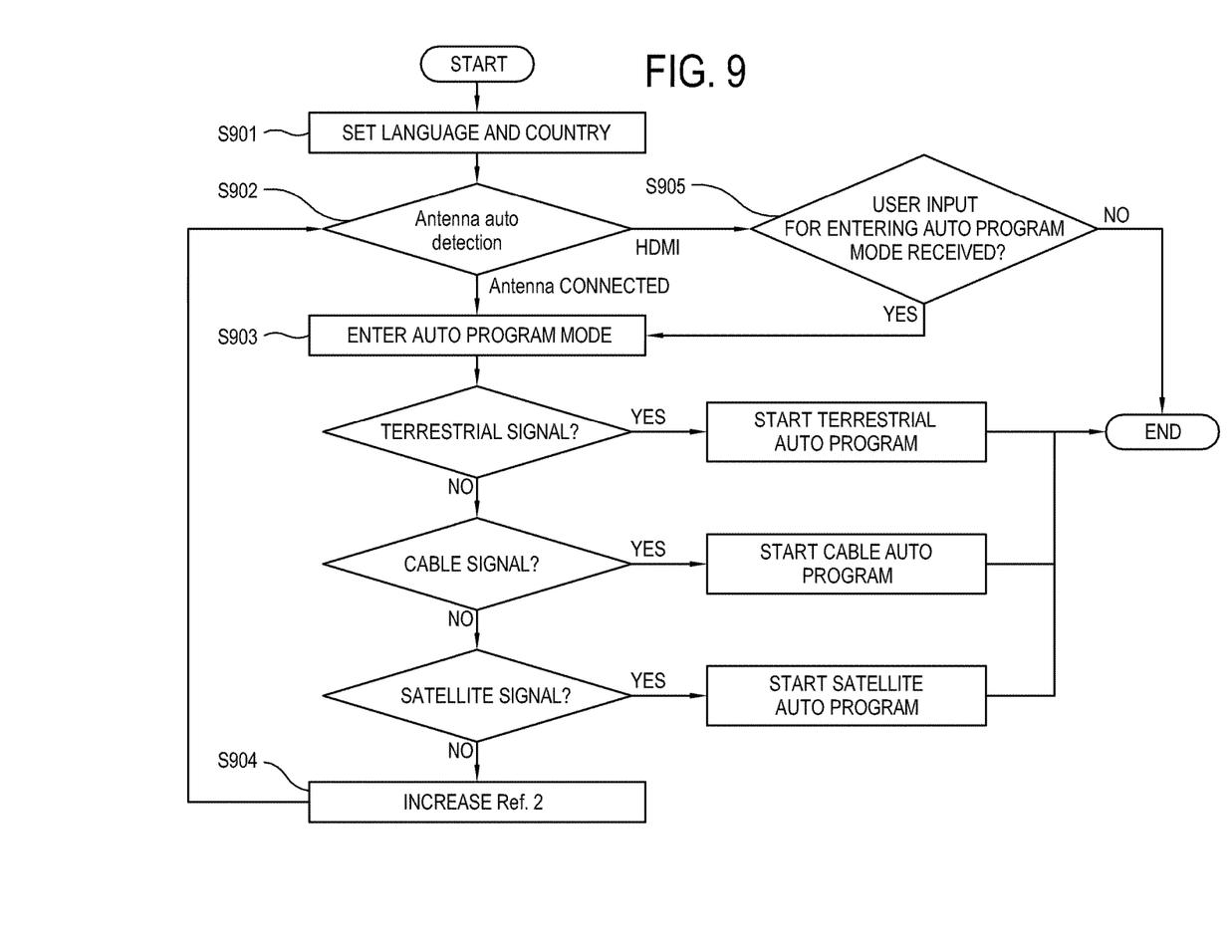
FIG. 9 is a flowchart illustrating an example of adjusting a second reference value in the broadcast receiver itself if self-feedback shows that determination of antenna connection is inaccurate according to an example embodiment of the present disclosure.

FIG. 9 is a flowchart illustrating an example in which the broadcast receiver 300 itself adjusts the second reference value if the self-feedback shows that determination of the antenna connection is inaccurate, as an embodiment of adjusting the reference value and the reference number of times in the broadcast receiver 300. Further, FIG. illustrates operations of the TV when the present disclosure is applied to the initial setting process of the TV as one of the broadcast receiver 300.

The initial setting process of the TV according to an example embodiment is the same as the conventional setting process up to an operation S901 where a user sets a language and a country. However, in the subsequent operations, the conventional setting process needs the process of receiving a user's input about whether the TV connects with the antenna or an HDMI input, and enters the channel auto-scan (e.g., auto program) mode only after a user inputs that the antenna is connected. On the other hand, the TV according to an example embodiment is capable of determining by itself whether the antenna is connected to the TV. Thus, after setting the language and the country in the initial setting process according to an example embodiment, the TV automatically determines whether the antenna is connected to the TV (S902) and directly enters the channel auto-scan when it is determined that the antenna is connected (S903).

If the first reference value, the second reference value or the reference number of times is not properly set, the TV may have an inaccurate result of determining whether the antenna is connected. For example, if no broadcast signals are searched even though a terrestrial signal, a cable signal and a satellite signal are scanned in sequence after the TV determines that the antenna is connected and thus enters the channel auto-scan mode, There is a need of adjusting the reference value or the reference number of times (S904). As an adjusting method, FIG. 9 illustrates an example of increasing the second reference value, but not limited thereto. Alternatively, the first reference value and the reference number of times may be adjusted as well as the second reference value, and it may also be possible to decrease the values or times.

The first reference value, the second reference value or the reference number of times adjusted as above is complemented through failed cases, and it is thus possible to obtain more accurate results if the adjusted reference value or reference number of times is used to determine whether the antenna is connected.

On the other hand, the antenna may be actually connected to the TV even though the TV enters not the channel auto-scan mode but the HDMI input mode by determining that the antenna is not connected. In this case, a user is allowed to directly input a command for entering the channel auto-scan (e.g., auto program) mode to the TV, thereby correcting an error (S905).

According to an example embodiment, the strength of a signal input to the broadcast receiver is rapidly measured, thereby automatically determining whether or not the antenna cable is connected to the broadcast receiver.

Further, according to an example embodiment, it is possible to more accurately determine whether the antenna is connected or not, based on the strength of the broadcast signal measured as above.

Although various example embodiments have been illustrated and described, it will be appreciated by a person having an ordinary skill in the art that various changes and modifications may be made in these example embodiments. For example, the foregoing results may be properly achieved even though the described operations may be performed in different order, or the described system, structure, device, circuit or the like elements may be differently coupled, combined or replaced or exchanged with other elements or equivalents. Therefore, it will be understood that the present disclosure is not limited to the foregoing example embodiments and the accompanying drawings, and other alternatives, other embodiments and equivalents belong to the appended claims. Further, the various example embodiments do not limit the present disclosure but are provided for illustrative purposes.

What is claimed is:
1. A broadcast receiver comprising:
an antenna connector configured to connect to an antenna receiving a broadcast signal comprising broadcast content;

a signal processor configured to generate a reference signal having a strength corresponding to the broadcast signal input through the antenna connector, and to process the generated reference signal while processing the broadcast signal to output an image signal for displaying the broadcast content; and a controller configured to identify whether the antenna is connected to the antenna connector based on the strength of the reference signal, and to perform subsequent operations related to whether the antenna is connected based on the identification, wherein the signal processor comprises an automatic gain controller configured to maintain a strength of the broadcast signal input through the antenna connector to be constant based on the reference signal, and wherein the strength of the reference signal is detected based on an output signal of a level detector of the automatic gain controller.

2. The broadcast receiver according to claim 1, wherein the signal processor is configured to generate the reference signal by performing at least one of: amplifying, filtering and/or mixing the signal input through the antenna connector to output the image signal.

3. The broadcast receiver according to claim 1, wherein the controller is configured to identify that the antenna is connected to the antenna connector based on the strength of the reference signal being equal to or higher than a first reference value, the strength of the reference signal being measured based on frequencies of the broadcast signal.

4. The broadcast receiver according to claim 1, wherein the controller is configured to identify that the antenna is connected to the antenna connector based on the strength of the reference signal being equal to or higher than a first reference value, or based on the strength of the reference signal being equal to or higher than a second reference value lower than the first reference value occurring more than a reference number of times.

5. The broadcast receiver according to claim 4, wherein the reference number of times is set based on a probability that a signal having a strength corresponding to the second reference value will be detected because of noise even when the antenna is not connected to the antenna connector.

6. The broadcast receiver according to claim 4, wherein the controller is configured to adjust the second reference value.

7. The broadcast receiver according to claim 1, wherein the antenna connector comprises a single input port to which one of a plurality antennas for respectively inputting signals corresponding to one of a plurality of broadcast types is connectable.

8. The broadcast receiver according to claim 1, wherein the controller is configured to perform a channel auto-scan with respect to the broadcast signal based on the identification that the antenna is connected to the antenna connector.

9. A method of controlling a broadcast receiver comprising a signal processor and an antenna connector, the method comprising:

generating, by the signal processor, a reference signal having a strength corresponding to a broadcast signal input through the antenna connector while processing the broadcast signal to output an image signal for displaying a broadcast content;

identifying whether an antenna is connected to the broadcast receiver based on the strength of the reference signal; and performing subsequent operations related to whether the antenna is connected based on the identification whether the antenna is connected to the broadcast receiver, further comprising maintaining, by an automatic gain controller of the signal processor, a strength of the broadcast signal input through the antenna connector to be constant based on the reference signal, and wherein the strength of the reference signal is detected based on an output signal of a level detector of the automatic gain controller.

10. The method according to claim 9, wherein the reference signal is generated by performing at least one of: amplifying, filtering and/or mixing the signal input to output the image signal.

11. The method according to claim 9, wherein the identifying whether the antenna is connected comprises identifying that the antenna is connected to the broadcast receiver based on the strength of the reference signal being equal to or higher than a first reference value, the strength of the reference signal being measured based on frequencies of the broadcast signal.

12. The method according to claim 9, wherein the identifying whether the antenna is connected comprises identifying that the antenna is connected to the broadcast receiver based on the strength of the reference signal being equal to or higher than a first reference value, or based on the strength of the reference signal being equal to or higher than a second reference value lower than the first reference value occurring more than a reference number of times.

13. The method according to claim 12, wherein the reference number of times is set based on a probability that a signal having a strength corresponding to the second reference value will be detected because of noise even when the antenna is not connected to the antenna connector.

14. The method according to claim 12, further comprising: adjusting, by the broadcast receiver, the second reference value.

15. The method according to claim 9, further comprising: performing a channel auto-scan with respect to a broadcast signal received in the broadcast receiver based on the identification that the antenna is connected to the broadcast receiver.

* * * * *